(12) United States Patent
Xiang

(10) Patent No.: US 6,583,488 B1
(45) Date of Patent: Jun. 24, 2003

(54) LOW DENSITY, TENSILE STRESS REDUCING MATERIAL FOR STI TRENCH FILL

(75) Inventor: Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 25 days.

(21) Appl. No.: 09/817,858

(22) Filed: Mar. 26, 2001

(51) Int. Cl.[7] .............................................. H01L 29/00
(52) U.S. Cl. ..................... 257/506; 257/347; 257/510; 438/424
(58) Field of Search ................................. 257/347, 354, 257/506, 510; 438/424

(56) References Cited

U.S. PATENT DOCUMENTS

| | | | |
|---|---|---|---|
| 4,903,108 A | 2/1990 | Young et al. ................ 257/501 |
| 4,916,086 A | 4/1990 | Takahashi et al. ........... 438/404 |
| 5,021,359 A | 6/1991 | Young et al. ................ 438/404 |
| 5,034,789 A | 7/1991 | Black ............................ 257/66 |
| 5,126,817 A | 6/1992 | Baba et al. ................... 257/347 |
| 5,258,332 A | 11/1993 | Horioka et al. ............. 438/389 |
| 5,264,395 A | 11/1993 | Bindal et al. ................ 437/228 |
| 5,279,865 A | 1/1994 | Chebi et al. ................. 427/574 |
| 5,405,480 A | 4/1995 | Benzing et al. ............. 156/345 |
| 5,416,041 A | 5/1995 | Schwalke .................... 438/404 |
| 5,416,048 A | 5/1995 | Blalock et al. ............. 438/695 |
| 5,445,988 A | 8/1995 | Schwalke .................... 438/432 |
| 5,470,802 A | 11/1995 | Gnade et al. ................ 438/781 |
| 5,496,765 A | 3/1996 | Schwalke .................... 438/404 |
| 5,516,710 A | 5/1996 | Boyd et al. .................. 438/309 |
| 5,569,058 A | 10/1996 | Gnade et al. ................ 445/24 |
| 5,578,518 A | 11/1996 | Koike et al. ................. 438/424 |
| 5,599,722 A | 2/1997 | Sugisaka et al. ............ 438/406 |
| 5,641,711 A | 6/1997 | Cho ............................. 438/763 |
| 5,646,053 A | 7/1997 | Schepis et al. .............. 438/402 |
| 5,683,075 A | 11/1997 | Gaul et al. ................... 257/510 |
| 5,741,740 A | 4/1998 | Jang et al. ................... 438/435 |
| 5,783,476 A | 7/1998 | Arnold ......................... 438/425 |
| 5,807,771 A | 9/1998 | Vu et al. ...................... 438/154 |
| 5,837,612 A | 11/1998 | Ajuria et al. ................ 438/697 |
| 5,841,171 A | 11/1998 | Iwamatsu et al. ........... 257/347 |
| 5,863,827 A | 1/1999 | Joyner ......................... 438/425 |
| 5,891,803 A | 4/1999 | Gardner ....................... 438/660 |
| 5,914,280 A | 6/1999 | Gelzinis ....................... 438/734 |
| 5,915,192 A | 6/1999 | Liaw et al. .................. 438/435 |
| 6,268,268 B1 | 7/2001 | Tokushige ................... 438/439 |
| 6,333,232 B1 * | 12/2001 | Kunikiyo ..................... 438/296 |
| 6,353,254 B1 | 3/2002 | Lee et al. ..................... 257/510 |
| 6,368,941 B1 | 4/2002 | Chen et al. .................. 438/424 |
| 6,413,827 B2 * | 7/2002 | Farrar .......................... 438/296 |
| 6,455,912 B1 * | 9/2002 | Kim et al. ................... 257/506 |
| 2002/0102814 A1 * | 8/2002 | Olsen .......................... 438/424 |

OTHER PUBLICATIONS

Ohno, et al. Experimental 0.25–$\mu$m–Gate Fully Depleted CMOS/SIMOX Process Using a New Two–Step LOCOS Isolation Technique. IEEE Transactions on Electron Devices, vol. 42, No. 8, (8/95), pps. 1481–1486; retrieved from Internet IEEE Xplore Citation wysiwyg://10/http://ieeexplore.ieee.org/. . .%2C+Y.%2C+M.%3B+Tuschiya%2C+T.

* cited by examiner

*Primary Examiner*—Richard Elms
*Assistant Examiner*—Christian D. Wilson
(74) *Attorney, Agent, or Firm*—Renner, Otto, Boisselle & Sklar, LLP

(57) ABSTRACT

A method of isolation of active regions on a silicon-on-insulator semiconductor device, including the steps of:

providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate; etching through the silicon active layer to form an isolation trench, the isolation trench defining an active region in the silicon active layer; forming a liner oxide by oxidation of exposed silicon in the isolation trench; and filling the isolation trench with a tensile stress-reducing low density trench isolation material, without thereafter densifying the tensile stress-reducing low density trench isolation material.

15 Claims, 4 Drawing Sheets

LOW DENSITY, TENSILE STRESS REDUCING MATERIAL FOR STI TRENCH FILL

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration (ULSI) require submicron features of significantly less than 0.25 microns, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by thermal oxidation of the semiconductor substrate, typically monocrystalline silicon, bounding the active regions. This type of isolation has been referred to as local oxidation of silicon, or LOCOS.

In an effort to enable the further reduction of the size of semiconductor devices, semiconductor-on-insulator (SOI) wafers increasingly have been used in very-large scale integration (VLSI) or ULSI of semiconductor devices. An SOI wafer typically has a thin layer of silicon on top of a layer of an insulator material. In SOI technology, the semiconductor device is formed entirely in and on the thin layer of silicon, and is isolated from the lower portion of the wafer by the layer of insulator material. In an SOI integrated circuit, essentially complete device isolation may be achieved using conventional device processing methods by surrounding each device, including the bottom of the device, with an insulator. One advantage which SOI wafers have over bulk silicon wafers is that the area required for isolation between devices on an SOI wafer is less than the area typically required for isolation on a bulk silicon wafer.

Another type of isolation structure is known as trench isolation, wherein shallow isolation trenches are etched in the substrate between the sites of semiconductor devices and an oxide liner is thermally grown on the trench walls. The trench is then refilled with an insulating material. The resulting structure is referred to as a shallow trench isolation (STI) structure. STI has been widely applied to VLSI and ULSI semiconductor devices, and has been applied recently to SOI integrated. circuits for such devices.

Trench isolation has several limitations, which may be exacerbated in SOI devices. One problem is that sharp corners at the top of the trench can result in junction leakage currents. More specifically, such sharp corners may cause unwanted increases in the sub-threshold currents in the channel regions along the edge of the device areas when the FETs are switched on. The device threshold voltage can also be lowered. In order to avoid these problems, it has been found desirable to round the corners of such trenches to increase the radius of curvature and thereby decrease the electric field at the corners. This has been accomplished by, for example, oxidizing the entire inner surface of the newly formed trench, taking advantage of the fact that an exposed corner of a silicon layer oxidizes faster than a flat surface of the silicon layer, thus forming a rounded upper corner at the top of the trench.

However, with SOI devices, the corner rounding solution leads to a new problem. The problem in SOI devices arises as a result of the proximity of the dielectric insulation layer below the silicon active layer. In SOI devices, the shallow isolation trench is etched through the silicon layer to the insulation layer. When the exposed portion of the silicon on the sidewalls of the newly formed trench is oxidized during the process of rounding the corners, a wedge or "bird's beak" of new oxide may form on the underside of the silicon active layer adjacent the isolation trench, between the silicon active layer and the underlying layer of insulating material of the SOI wafer. Thus, as the oxide grows on the sidewalls of the trench, it may grow laterally between the lower edge of the silicon active layer and the underlying oxide insulation layer. In essence, during the process of oxidation which is intended to round the upper corner of the silicon active layer, the lower corner of the silicon active layer is also rounded, forming the "bird's beak" between the silicon active layer and the underlying oxide insulation layer. The problem results when, during subsequent high temperature processing steps after the trench has been filled with a trench fill material, thermal expansion of the trench fill material and of the "bird's beak" creates defects in the silicon crystal structure and/or lifts the silicon layer, due to the pressure of the differently expanding trench fill material in particular, and to some degree, due to expansion of the oxide of the bird's beak. The resulting defects in the crystal structure of the active region may change the electrical characteristics of the semiconductor. The lifting of the silicon layer distorts the surface of the semiconductor device from its desired planarity to an undesirable non-planar condition. As semiconductor device dimensions continue to become smaller, problems such as these both occur more easily and become less tolerable.

Thus, there exists a need for STI methodology applicable to SOI semiconductor devices wherein the problems resulting from sharp corners can be alleviated without the problems resulting from "bird's beak" on the underside of the silicon active layer adjacent the isolation trench.

SUMMARY OF THE INVENTION

The present invention provides a method of avoiding problems commonly associated with formation of the "bird's beak" while providing rounded upper corners on the silicon active layer in shallow trench isolation of SOI semiconductor devices.

In one embodiment, the present invention relates to a method of isolation of active regions on a silicon-on-insulator semiconductor device, comprising the steps of:

providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate;

etching through the silicon active layer to form an isolation trench, the isolation trench defining an active region in the silicon active layer;

forming a liner oxide by oxidation of exposed silicon in the isolation trench; and filling the isolation trench with a tensile stress-reducing low density trench isolation material, without thereafter densifying the low density trench isolation material.

In one embodiment, the method further comprises rounding at least one square upper corner of the silicon active layer.

In one embodiment, the step of forming the liner oxide occurs simultaneously with the step of rounding at least one square upper corner. In one embodiment, the step of forming a liner oxide results in formation of a bird's beak. In one embodiment, the step of forming a liner oxide occurs substantially simultaneously with the step of rounding at least one corner of the silicon active layer. In one embodiment, the tensile stress-reducing low density trench isolation material comprises a plurality of dielectric spacers. In one embodiment, the plurality of dielectric spacers comprise a dielectric gas. In one embodiment, the tensile stress-reducing low density trench isolation material has a dielectric constant in the range from about 1.05 to about 3.5.

In another embodiment, the present invention relates to a method of making a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate, in which active regions are isolated and defined by a shallow trench isolation structure, comprising the steps of:

etching through the silicon active layer to form an isolation trench, the isolation trench defining the active region in the silicon active layer;

oxidizing exposed silicon in the isolation trench to round at least one upper corner and form a liner oxide;

filling the isolation trench with a tensile stress-reducing low density trench isolation material; and thereafter refraining from densifying the tensile stress-reducing low density trench isolation material.

In another embodiment, the present invention relates to a silicon-on-insulator semiconductor device, comprising:

a silicon-on-insulator wafer having a silicon active layer, a dielectric isolation layer a silicon substrate, and at least one isolation trench defining an active region in the silicon active layer, in which the silicon active layer is formed on the dielectric isolation layer and the dielectric isolation layer is formed on the silicon substrate;

wherein the at least one isolation trench is filled with a tensile stress-reducing low density silicon dioxide trench isolation material which comprises spacers containing a dielectric gas.

In one embodiment, the tensile stress-reducing low density trench isolation material has a dielectric constant in the range from about 1.05 to about 3.5.

Thus, the present invention provides methods of STI applicable to SOI semiconductor devices which do not suffer from problems resulting from formation of a "bird's beak" on the underside of the silicon active layer adjacent the isolation trench, while still allowing formation of isolation trenches which provide for complete electrical isolation of adjacent active regions in the SOI wafer.

DETAILED DESCRIPTION

The method of the present invention may be applied to a silicon-on-insulator (SOI) semiconductor wafer at any time subsequent to the formation of a silicon-on-insulator (SOI) wafer. In one embodiment, the method is applied following fabrication of the SOI wafer and fabrication of at least some of the elements of a semiconductor device on the SOI wafer.

Figure 1:
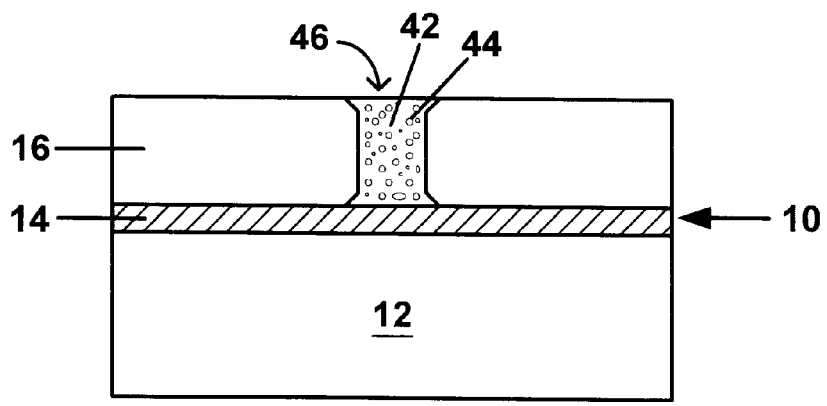
FIG. 1 is a partial cross-sectional view of one embodiment of an SOI wafer following formation of a shallow trench isolation structure, in accordance with the present invention.

The present invention relates to an SOI wafer including a shallow trench isolation (STI) structure between active regions, in which the STI structure includes a low density trench isolation material. FIG. 1 is a partial cross-sectional view of an SOI wafer 10 following formation of a shallow isolation trench including a low density trench isolation material, in accordance with the present invention. The SOI wafer 10 shown in FIG. 1 includes a substrate 12, a dielectric isolation material layer 14 and an active silicon layer 16. The SOI wafer 10 shown in FIG. 1 further includes an STI structure 46 which is formed of a tensile stress-reducing low density trench isolation material 42.

In accordance with the invention, and shown schematically in FIG. 1 (and in FIGS. 8 and 9), the low density trench isolation material 42 includes a plurality of dislocations, gaps, spaces, and/or pockets of air or other dielectric gas, which may be referred to generally as dielectric spacers 44. The dielectric spacers 44 are shown schematically in FIG. 1. As result of the inclusion of the dielectric spacers 44, the trench isolation material 42 has both a low density and a low overall or average dielectric constant. The dielectric spacers 44 are actually microscopic, atomic-scale gaps or spaces remaining in the low density trench isolation material 42 as a result of the formation of the material 42. In a conventional trench isolation, when such a low density material is produced, it is subsequently densified. The present inventor has discovered that retention of the low density material provides reduction or elimination of tensile stress in the shallow trench isolation structure, thereby avoiding the undesirable effects of the bird's beak.

The present invention further relates to a method of isolation of active regions on a SOI semiconductor device. In the first step of the method, a SOI semiconductor wafer having a silicon active layer, a dielectric isolation layer and a silicon substrate is provided. In one embodiment, the silicon active layer is formed on the dielectric isolation layer and the dielectric isolation layer is formed on the silicon substrate. In one embodiment, the silicon active layer is a monocrystalline silicon. As used herein, the term "monocrystalline" means a crystal lattice structure substantially without defects in the crystal structure and containing few impurities. The SOI wafer may be formed by any technique for forming such wafers, as described more fully below.

Figure 2:
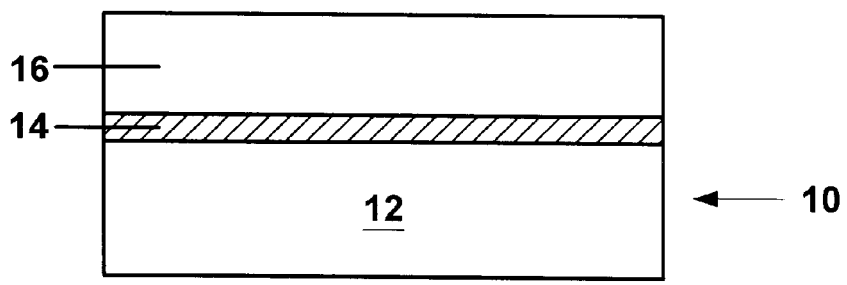
FIG. 2 is a partial cross-sectional view of an SOI wafer.

FIG. 2 shows a partial cross-sectional view of an SOI wafer 10, with a silicon substrate 12, a buried oxide layer 14 and a silicon active layer 16. The silicon active layer 16 may include one or more semiconductor devices. The silicon active layer 16 may be a part of a newly fabricated SOI wafer, in which semiconductor devices have not yet been fabricated. In one embodiment, the silicon active layer 16 is part of an SOI wafer in which a plurality of semiconductor devices have been formed, or are in the process of being formed. In such embodiment, the silicon active layer 16 includes at least one semiconductor device element. The SOI wafer shown in FIG. 2 is only a small portion of a much larger SOI wafer, of which the silicon active layer 16 will be divided into a plurality of active regions, which may be isolated one from another by application of the method of the present invention. As will be understood by those of skill in the art, a cross-sectional view of a single isolation structure is shown in the drawings of and described in the present disclosure, although the method is applicable to formation of a plurality of such isolation structures simultaneously.

The SOI wafer 10 used in the present invention may be an SOI wafer formed by any method known in the art for forming SOI wafers. The present invention, as described herein, is broadly applicable to any SOI wafer. The method of the present invention may be applied to a previously formed SOI wafer, and thus is not limited to any particular method of forming the SOI wafer, and is not limited to any particular type of SOI wafer. In one embodiment, for example, the SOI wafer may be a silicon-on-sapphire wafer.

In one embodiment, the substrate 12 is silicon. In one embodiment, the substrate 12 is n- or p-doped silicon. The substrate 12 may be any material known in the art for use as a substrate in an SOI wafer.

In one embodiment, the dielectric insulation layer 14 is an oxide of silicon. In one embodiment, the dielectric insulation layer 14 is silicon dioxide. The dielectric insulation layer 14 may be any material known in the art for use as a dielectric insulation layer in an SOI wafer.

In one embodiment, the silicon active layer 16 is monocrystalline silicon. In one embodiment, the silicon active layer 16 is n- or p-doped silicon. In one embodiment, the silicon active layer 16 is n- or p-doped monocrystalline silicon. The silicon active layer 16 may include additional semiconductor device elements.

In the second step of the method of the present invention, an isolation trench is formed by etching the silicon active layer in selected areas so as to leave a layer of silicon from the silicon active layer unetched at the bottom of the isolation trench. In forming the isolation trench, at least one active region is defined in the silicon active layer.

The isolation trench may be formed by a series of conventional steps, as will be recognized upon review of FIGS. 2–6. The following description relating to the steps of forming the isolation trench as illustrated in FIGS. 2–6 is exemplary. The steps of forming the isolation trench may be carried out by any known method for forming a shallow isolation trench, and the method of the present invention is not limited to any particular process for forming the trench, as long as the method selected provides sufficient control of the etching process that the process can be terminated at the selected time, i.e., when the etching has reached, i.e., has etched through to, the underlying dielectric isolation layer 14. The etching should not penetrate through the underlying dielectric isolation layer 14.

Figure 3:
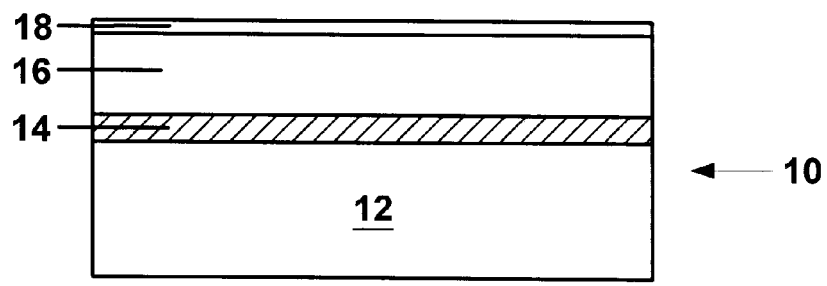
FIG. 3 is a partial cross-sectional view of an SOI wafer following application of a pad oxide layer.
Figure 4:
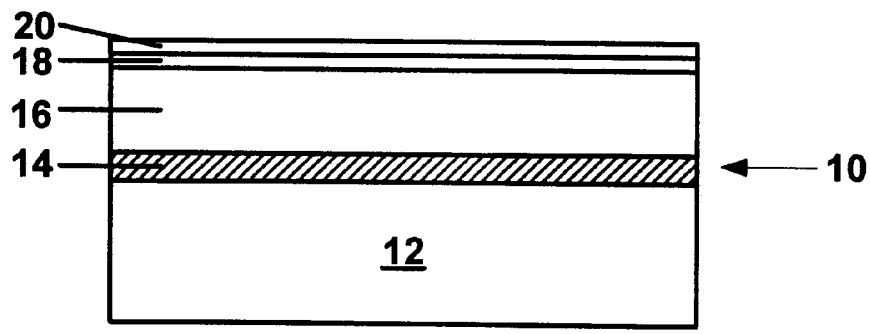
FIG. 4 is a partial cross-sectional view of an SOI wafer following application of a hard mask layer over a pad oxide layer.
Figure 5:
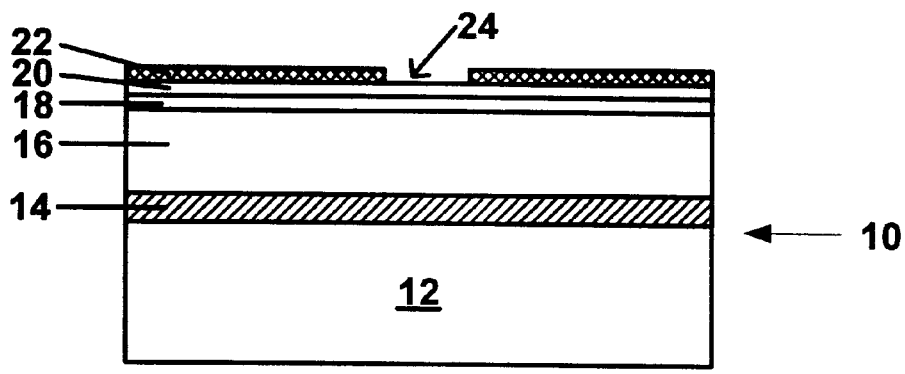
FIG. 5 is a partial cross-sectional view of an SOI wafer following application of a patterned photoresist layer over a hard mask layer and pad oxide layer.
Figure 6:
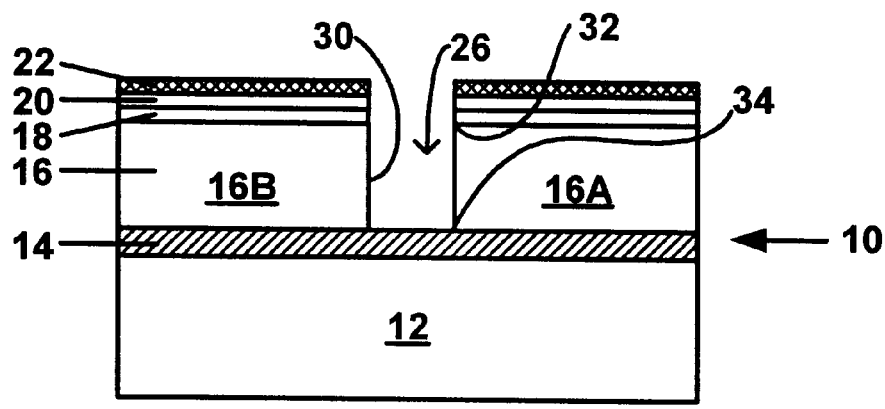
FIG. 6 is a partial cross-sectional view of the SOI wafer of FIG. 5 following one or more steps of etching to form an isolation trench.

A typical method of trench formation comprises initially growing a pad oxide layer 18 on the substrate as shown in FIG. 3. A nitride layer 20 may be deposited over the pad oxide, as shown in FIG. 4. A photoresist mask 22 is then applied to define the trench areas 24, as shown in FIG. 5. The exposed portions of the nitride layer, if present, are then etched away, followed by etching away of the exposed pad oxide layer. The etching continues into the thus-exposed substrate to form a shallow trench 26, as shown in FIG. 6. When etching of the trench 26 is completed, the photoresist is stripped off the remaining nitride layer 20.

Next, the substrate is oxidized to form an oxide liner on the walls and base of the trench to control the silicon-silicon dioxide interface quality and to remove etching-induced damage. The trench is then refilled, such as by coating the entire surface of the semiconductor wafer, with an insulating material (or "trench fill"), such as an oxide, for example, silicon dioxide derived from tetraethyl orthosilicate (TEOS). When a nitride layer is present, the surface may then be planarized, as by chemical-mechanical polishing (CMP) using the nitride layer as a polish stop. In subsequent operations, the nitride and pad oxide are stripped off, and a gate oxide layer is grown on the exposed silicon of the substrate. When no nitride layer is present, the oxide coating is etched back by anisotropic etching or polishing, so that the oxide layer remains in the trench. Thereafter, the wafer is further processed to form a semiconductor device.

When the selected pattern has been formed in the photoresist layer 24, and the photoresist developed, the SOI wafer 10 can then be etched to form the at least one isolation trench. In one embodiment, the etching is an anisotropic etch, in which the etching takes place in the downward direction (downward from the silicon active layer 16 towards the substrate 12 in, e.g., FIG. 6), but substantially less or not in a lateral direction. In one embodiment, the etching step to form the isolation trench is by reactive ion etching (RIE).

An isolation trench 26 is shown in FIG. 6. The isolation trench 26, together with other similar isolation trenches, forms and defines a plurality of active islands, exemplified by active islands 16A and 16B, in the silicon active layer 16 shown in FIG. 6.

Any method known in the art for etching the various layers which have been applied over the silicon active layer 16 of the SOI wafer 10 may be used to form the isolation trench 26, and thereby define the active islands 16A and 16B. Thus, for example, a series of etching steps may be used, to etch first through the hard mask layer 22, then through the pad oxide layer 20, and finally through the silicon active layer 16.

In one embodiment, the etching step of the present invention penetrates through the silicon active layer to the underlying dielectric insulation layer, in forming the isolation trench 26, as shown in FIG. 6. In one embodiment, the etching step penetrates through the silicon active layer 16 across the entire width of the isolation trench 26, leaving none of the original silicon of the silicon active layer in the isolation trench 26, in forming the isolation trench 26. The etching step may penetrate not only through the silicon active layer 16 but also slightly into the underlying dielectric insulation layer 14, in forming the isolation trench 26. Although the etching reaches or etches into the dielectric insulation layer 14, it should not penetrate through the layer 14. In one embodiment, the etching step does not reach the underlying dielectric insulation layer 14 across the full width of the isolation trench 26. However, in order to assure complete isolation of each of the plurality of active islands, e.g., the active islands 16A and 16B, one from another, the etching step to form the isolation trench 26 should reach the underlying dielectric insulation layer 14 across at least a portion of the width along the entire length of the isolation trench 26. In other words, while the trench may not reach the dielectric insulation layer 14 across its full width, there should be no semiconductor connection (i.e., the original silicon of the silicon active layer 16) remaining in contact with, or forming a contact between, opposite sides of the isolation trench 26. Ideally, the etching step to form the isolation trench 26 should reach the underlying dielectric insulation layer 14 across its entire width along its entire length, but this may not always occur in actual practice.

In the third step of the method of the present invention, at least one corner of the active island in an upper portion of the silicon active layer is rounded. Corner rounding has been found useful in avoiding undesired electronic effects resulting from sharp corners in the silicon active layer 16. In one embodiment, a sidewall of the trench 26 is oxidized by the corner rounding step, to form a sidewall liner oxide 36.

The terms "square" or "substantially square" as used herein refer to corners of the silicon active layer 16 immediately following the step of etching through the silicon active layer to form an isolation trench, at which time the corners are relatively sharp, and have a generally square appearance. It should be recognized that the corners may depart from exact orthogonality (i.e., an angle of 90° between the upper surface of the silicon active layer 16 and the sidewall of the isolation trench 26), such that the corners are substantially orthogonal. Substantially orthogonal means that the angle formed between the upper surface of the silicon active layer 16 and the sidewall of the isolation trench 26 falls in the range from about 80° to about 100°. The square or substantially square corner is further defined as a corner which is sufficiently sharp to result in the unwanted electronic effects described herein.

The terms "round" or "rounding" or "rounded" as used herein refer to the changed shape of one or more corners of the silicon active layer 16 from a condition in which the corner is relatively sharp, described as square or substantially square as defined above, to a condition in which the corner has been rounded or otherwise rendered not square, so that the undesired electronic effects are not observed. Thus, a rounded corner is further defined as a corner which has been rounded to a degree sufficient to avoid substantially the unwanted electronic effects described herein.

Rounding of the corners may include actual rounding, in which the sharp or square corner is modifed to have a radius of curvature, i.e., to include a "curved corner" having a regular curve. Rounding of the corners may include rounding in which the corner has an uneven, irregular curve such as an ellipsoid curve. Rounding of the corners may include chamfering, in which the corner is modified to have a chamfered face, and may include multiple chamfers, in which the corner is changed to have a series of chamfered faces, i.e., a "polygonal corner". The exact shape of the rounded corner is less important than is the absence of the unwanted electronic effects described herein.

As shown in FIG. 6, the newly etched isolation trench 26 includes an upper square corner 32 and a lower square corner 34 in the active islands, e.g., 16B. If the upper square corner 32 is not rounded, the sharpness of the upper square corner 32 may result in undesired electronic effects in the active island, as known in the art and described in the above background section. Thus, it is desirable that the upper square corner 32 be rounded.

In one embodiment, an upper rounded corner 38 is formed by an oxidation of the silicon of the silicon active layer, in which the upper square corner 32 of the silicon active layer becomes rounded. This oxidation causes the rounding of square corners because the oxidation proceeds more rapidly at a corner than at a flat surface such as the sidewall of the isolation trench.

Figure 7:
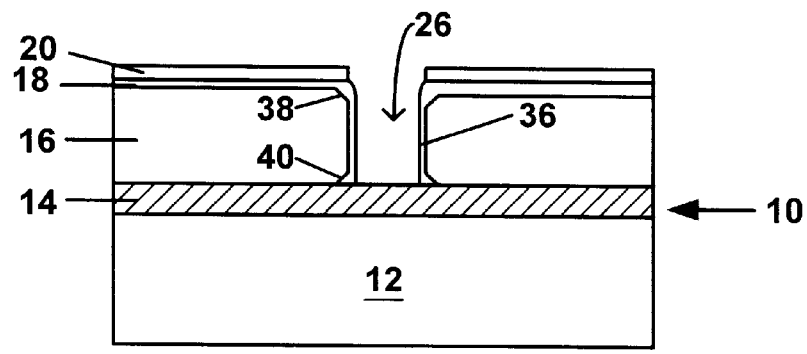
FIG. 7 is a partial cross-sectional view of one embodiment of an SOI wafer in which the sidewalls have been oxidized to form a trench liner, and the upper square corners of the silicon active layer have been rounded.

As shown in FIG. 7, the upper rounded corner 38 has been formed from the square corner 32 of the active island 16A shown in FIG. 6. However, in addition, the lower square corner 34 has been rounded to form a bird's beak 40, as shown in FIG. 7, on the lower sides of the active islands 16A and 16B. Conventionally, if allowed to remain, the bird's beak 40 would cause stress in the active island 16A, with resultant changes in crystal structure and electronic properties. However, in accordance with the present invention, the bird's beak 40 is allowed to form and to remain without the conventional problems associated therewith, as further discussed below.

In one embodiment, the step of rounding corners is carried out by a thermal oxidation of exposed silicon surfaces of the active islands at a temperature of about 1000° C. in an oxygen-containing atmosphere. In one embodiment, the thermal oxidation results in rounding the upper square corners 32 to a greater extent than the lower square corners are rounded.

In one embodiment, the rounded corner is formed by a reaction other than oxidation. Other agents known in the art which etch or otherwise react with the silicon of the silicon active layer 16 may be employed. In one embodiment, the upper rounded corner 38 is formed by a reaction other than a thermal oxidization. Other methods known in the art for oxidizing the silicon of the silicon active layer 16 to round corners may be employed. Such other agents include, for example, chlorine together with oxygen, as described in U.S. Pat. No. 6,150,234. Any method known in the art for rounding such corners may be employed in the method of the present invention. Oxidation is generally preferred, since it forms an insulating dielectric material for a sidewall oxide layer, which need not be removed prior to filling of the trench.

While the corners are illustrated in FIGS. 1 and 7–9 as chamfered, the corners may be chamfered, smoothly rounded, unevenly rounded or polygonally rounded. The scope of the invention is not limited to any particular "rounded" corner. As described above, the step of rounding the corner may produce an upper rounded corner 38 having a variety of shapes, with the only proviso being that the upper rounded corner 38 not cause the disfavored electronic effects which would result if the upper square corner 32 was allowed to remain in the SOI wafer 10.

In an embodiment in which the rounding step produces "round", i.e., curved rather than polygonal, rounded corners 38, the radius of curvature should be at least about 50 nm for an SOI wafer 10 having a silicon active layer about 50 nm thick. In an embodiment in which the rounding step produces polygonal rounded corners 38, a theoretical radius of curvature, approximated by drawing an arc connecting the intersections of the sides of the polygon should be at least about 50 nm. In one embodiment, the radius of curvature is in the range from about 50 nm to about 100 nm. In one embodiment, the radius of curvature is in excess of 100 nm. In one embodiment, the radius of curvature is in excess of 200 nm. For reasons relating to subsequent steps in the method of the present invention, it may be beneficial to increase the radius of curvature to the range of 100 nm to 200 nm. The radius of curvature is dependent of the method used to generate the rounding. The radius of curvature is scalable, and will continue to change as device dimensions become smaller. The radius of curvature is independent of the thickness of the silicon active layer 16.

In one embodiment, the step of rounding corners includes formation of a sidewall liner oxide 36 from the silicon exposed on the sidewalls of the isolation trench 26, as shown in FIG. 7. The sidewall oxide liner 36 is shown in FIG. 7 as extending laterally outward from the edge of the original silicon of the silicon active layer 16. This schematically illustrates the fact that when silicon dioxide is formed by oxidation of a given quantity of silicon, the silicon dioxide has a larger volume than the original silicon. Formation of the sidewall oxide liner 36 results in smoothing any rough or uneven areas in the sidewall 30.

In one embodiment, the upper square corner 32 and the lower square corner 34 are rounded differentially. In one embodiment, the differential rounding results in rounding of the upper square corner 32 to a greater degree than the rounding of the lower square corner 34. Although not to be bound by theory, it is thought the differential rounding may be due to physical parameters which limit access of the oxidizing medium to the lower square corner 34. The differential rounding is of particular benefit in the present invention, since any effects of the bird's beak 40 are thus minimized.

In the fifth step of the method of the present invention, the isolation trench 26 is filled with the low density trench isolation material 42. The low density trench isolation material 42 may be any material known in the art for use as an isolation material for shallow trench isolation in semiconductor devices, so long as the trench isolation material can be formed so as to have a low density. In one embodiment, the low density trench isolation material 42 is silicon dioxide. The low density generally results from voids, or pockets of air or other dielectric gas. In the present invention, the low density trench isolation material 42 is not densified, but is instead retained in its low density state. As a result of the low density, in subsequent thermal processing, any thermal expansion of the active regions against the trench isolation material 42 is absorbed by the trench isolation material, and the little thermal expansion of the trench isolation material 42 itself is self-absorbed. That is, due to the porous nature of the low density trench isolation material, any thermal expansion in the low density trench isolation material is on a local basis only, and is absorbed locally. As a result, the low density trench isolation material of the present invention acts as a tension stress reduction material.

As described above with respect to FIG. 1, the low density trench isolation material 42 comprises a plurality of dielectric spacers 44, which are formed of dislocations, defects, spaces, gaps, voids or pockets, containing air or other dielectric gases. The dielectric spacers 44 have the beneficial effects both of reducing the density and of reducing the dielectric constant of the low density trench isolation material 42.

A particular benefit obtained from the present invention is the low dielectric constant of the low density trench isolation material 42. The dielectric constant of silicon dioxide is about 3.9. The dielectric constant of air is 1.0 by definition. Thus, incorporation of air into the low density trench isolation material 42, by the presence of the dielectric spacers 44, reduces the dielectric constant, and therefore increases the insulative qualities of the trench isolation material. In one embodiment, the dielectric constant of the low density trench isolation material 42 is in the range from about 1.05 to about 3.5. In another embodiment, the dielectric constant of the low density trench isolation material is in the range from about 1.1 to about 3.0. In another embodiment, the dielectric constant of the low density trench isolation material 42 is in the range from about 1.25 to about 2.0. In another embodiment, the dielectric constant of the low density trench isolation material 42 is in the range from about 1.5 to about 2.5. Thus, the low density trench isolation material 42, by inclusion of the dielectric spacers 44, provides both improved electrical isolation and avoids the problems resulting from formation of the bird's beak 40 during the step of rounding at least one corner.

The low density trench isolation material 42 may be formed by any suitable method. In one embodiment, the low density trench isolation material 42 is formed by atomospheric or subatmospheric pressure CVD of TEOS (tetraethylorthosilicate) or of another organic silicon compound. A method of applying such materials by CVD to form a porous silica film is disclosed in U.S. Pat. No. 6,054,206, the disclosure of which is incorporated herein by reference. In this embodiment, an organic-group-containing silica precursor is first deposited on a semiconductor substrate in a CVD reactor. Then, the organic groups are removed by heating in a furnace in an oxidizing environment or by exposure to an oxidizing plasma, to create a low density silica film. In the present invention, this method may be used to deposit the low density trench isolation material 42 in the isolation trenches 26. As a result, a tensile stress reducing, low density trench isolation material 42 is provided.

In another embodiment, the low density trench isolation material 42 is formed by a sol-gel process for applying a silica aerogel thin film on a semiconductor substrate, such as that disclosed in U.S. Pat. No. 5,569,058, the disclosure of which is incorporated herein by reference. In this embodiment, a layer comprising a silica-based aerogel is applied to the semiconductor substrate, including into the isolation trench 26. The gel is formed by reacting TEOS in ethanol and water with HCl and then treating the resulting mixture with ammonium hydroxide. This gel solution is applied to the semiconductor substrate. Upon drying slowly, the aerogel is formed. As an optional additional step, the layer comprising the dried aerogel silica may be covered by a more dense layer of silicon dioxide. As a result, a tensile stress reducing, low density trench isolation material is provided.

In another embodiment, the low density trench isolation material 42 is formed by a sol-gel process for applying a silica aerogel thin film on a semiconductor substrate, such as that disclosed in U.S. Pat. No. 5,470,802, the disclosure of which is incorporated herein by reference. The method of applying the sol-gel of this embodiment is similar to that disclosed in the previous aerogel embodiment. As a result, a tensile stress reducing, low density trench isolation material is provided.

In one embodiment, the low density trench isolation material 42 may be applied by a high density plasma method, such as that disclosed in U.S. Pat. No. 5,981,402, the disclosure of which is incorporated herein by reference. In this embodiment, a low density silicon dioxide layer is formed by HDP with a high Ar flow and high RF bias power. As a result, a tensile stress reducing, low density trench isolation material is provided. The HDP conditions may be varied so as to adjust the density of the trench isolation material, for example by adjusting the Ar flow and the RF bias power. In one embodiment, the low density of the trench isolation material is retained by avoiding high temperature conditions under which densification of the trench isolation material could take place. In another embodiment, the low density of the trench isolation material is retained by omitting any densification step following deposition of the trench isolation material.

Figure 8:
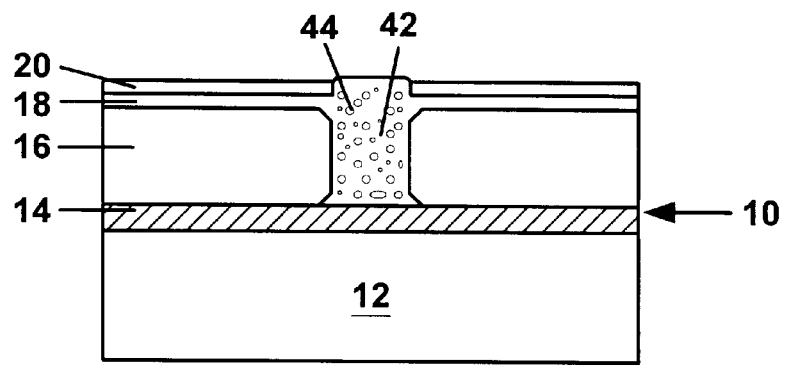
FIG. 8 is a partial cross-sectional view of an embodiment of an SOI wafer following a step of filling the isolation trench with a low density trench isolation material.
Figure 9:
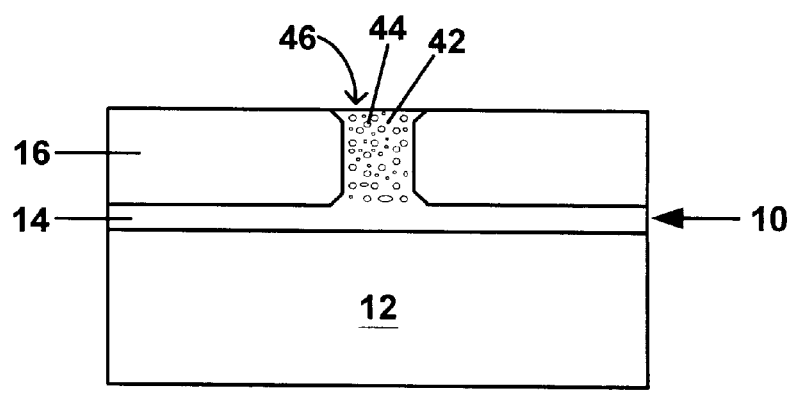
FIG. 9 is a partial cross-sectional view of another embodiment of an SOI wafer following formation of a shallow isolation trench, in accordance with the present invention, similar to that of FIG. 1.

The low density trench isolation material 42, shown in FIGS. 1, 8 and 9, may be formed of any material known in the art. In one embodiment, the low density trench isolation material 42 is an oxide. In one embodiment, the low density trench isolation material 42 is an oxide of silicon. In one embodiment, the low density trench isolation material 42 is silicon dioxide, $SiO_2$. The low density trench isolation material may comprise other dielectric materials, such as SiON, which can provide the function of electrically insulating adjacent active regions on an SOI wafer from each other, which may be deposited by a similar method, and which includes the dielectric spacers 44.

As suggested by FIG. 8, in an embodiment in which the pad oxide layer 18, the low density trench isolation material 42, and the trench oxide liner are all the same material or are substantially similar materials, these structures may form a combined structure of which the parts are essentially indistinguishable from each other, except for the presence of the dielectric spacers 44, although they were formed by different process steps at different times in the method of the present invention. The SOI wafer 10 shown in FIG. 8 is a schematic representation of such a structure, in which the separate parts are not distinctly separated. In one embodiment, pad oxide layer 18, the low density trench isolation material 42, and the trench oxide liner are all silicon dioxide.

Following deposition of the low density trench isolation material 42, excess material is removed from the SOI wafer 10, to produce a SOI wafer 10 as shown in FIG. 1, in which respective silicon active layers of adjacent active regions have been separated by a shallow trench isolation (STI) structure 46. The STI structure 46 shown in FIG. 1 is formed of the low density trench isolation material 42, including the dielectric spacers 44, and the trench oxide liner 36.

The excess material which is removed from the SOI wafer includes any layers applied in carrying out the method of the present invention, such as the pad oxide layer 18 and the hard mask layer 20, and any excess low density trench isolation material 42. These layers and any other excess materials are removed by techniques known in the art, such as by etching or chemical mechanical polishing (CMP).

FIG. 9 shows an embodiment of the SOI wafer 10 obtained by the method of the present invention similar to that shown in FIG. 1. FIG. 9 shows an embodiment in which the shallow trench isolation structure 46 (which includes the low density trench isolation material 42, the dielectric spacers 44 and the trench oxide liner 36) and the dielectric isolation layer 14 are all formed of the same material or are formed of substantially similar materials, such as silicon dioxide. As depicted in FIG. 9, these structures may form a combined structure in which the parts are essentially indistinguishable from each other, except for the presence of the dielectric spacers 44 in the low density trench isolation material 42, although they were formed by different process steps at different times in the method of the present invention. The SOI wafer 10 shown in FIG. 9 is a schematic representation of such a structure, in which the separate parts are not distinctly separated. In one embodiment, the low density trench isolation material 42, the trench oxide liner and the dielectric isolation layer 14 are all silicon dioxide. In one embodiment, the low density trench isolation material 42, the trench oxide liner 36 and the dielectric isolation layer 14 are chemically indistinguishable from each other, except for the low density nature of the trench isolation material 42.

Figure 10:
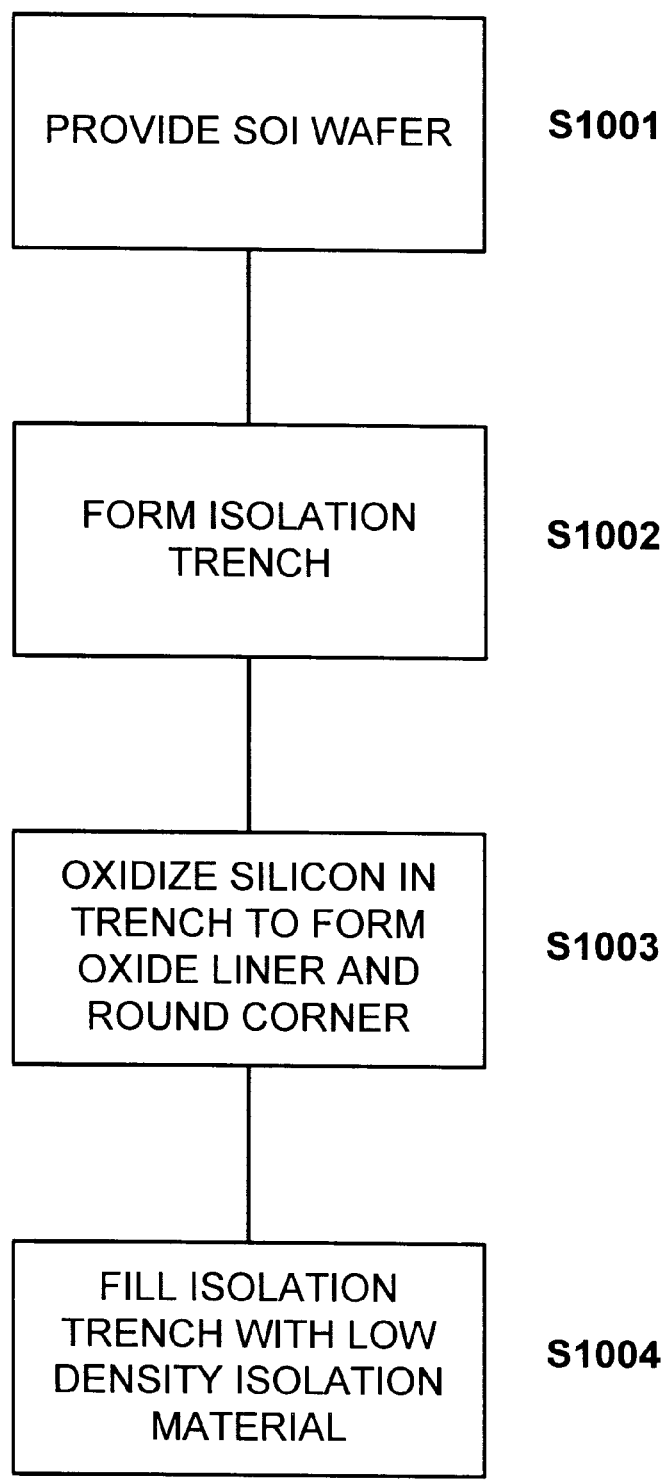
FIG. 10 is a is a flow diagram of one embodiment of a method of isolation of active regions on a SOI wafer.

FIG. 10 is a block flow diagram illustrating the method of the present invention. As shown in FIG. 10, in one embodiment, the present invention relates to a method of isolation of active regions on a silicon-on-insulator semiconductor device. A first step of the method, shown in FIG. 10, is step S1001, in which a silicon-on-insulator (SOI) semiconductor wafer is provided. The SOI wafer includes a silicon active layer, a dielectric isolation layer and a silicon substrate, in which the silicon active layer is formed on the dielectric isolation layer and the dielectric isolation layer is formed on the silicon substrate. The SOI wafer may be made by any method known in the art.

In a second step, step S1002 in FIG. 10, an isolation trench is formed in the silicon active layer of the SOI wafer by etching the silicon active layer; however, according to the present invention, the etching is terminated at a time when an unetched silicon layer remains at the bottom of the isolation trench. The step S1002 may include one or a plurality of additional or preparatory steps, such as forming a pad oxide layer, forming a hard mask layer, and forming a photoresist layer having a predetermined pattern by lithography, in addition to one or a plurality of etching steps. The etching steps, as well as the additional or preparatory steps, may be carried out by any methods known in the art, with the proviso that the etching step does not completely etch through the silicon active layer, and leaves an unetched silicon layer at the bottom of the nascent isolation trench.

In a third step, step S1003 in FIG. 10, silicon in the unetched silicon layer at the bottom of and in the sidewalls of the isolation trench is oxidized to form a trench oxide liner in the isolation trench. In one embodiment, during and as part of the oxidizing step, square upper corners of the silicon active layer are rounded. In one embodiment, all three of these steps take place substantially simultaneously. It is possible that one or two of these steps may continue longer than another, if one or two step(s) require(s) a longer oxidation time. Step S1003 may be carried out by any method known in the art for oxidizing such materials.

In the fourth step, step S1004 in FIG. 10, the isolation trench is filled to a level at least above the upper surface of the silicon active layer, with a tensile stress-reducing low density trench isolation material. In one embodiment, the trench is filled with the tensile stress-reducing low density trench isolation material to a level above the top surface of the highest layer which has been applied over the surface of the SOI wafer. In one embodiment, the step of filling is carried out by applying a layer of a low density insulating material over substantially the entire surface of the SOI wafer 10, which includes filling the isolation trench. Step S1004 may be carried out by any method known in the art for depositing such materials.

Following the filling step, the SOI wafer may be further processed by, e.g., removing excess material such as the pad oxide layer, the hard mask layer and excess low density trench isolation material, from the surface of the SOI wafer.

The method of the present invention provides a shallow trench isolation structure which substantially completely electrically isolates and thereby defines an active region in the silicon active layer of the SOI wafer. In one embodiment, the shallow trench isolation structure and the dielectric isolation layer form an integral isolation structure for an active region in the silicon active layer of the SOI wafer.

Following the steps of the present invention, the SOI wafer may be further processed in the fabrication of semiconductor devices in a known manner.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A silicon-on-insulator semiconductor device, comprising:
   a silicon-on-insulator wafer having a monocrystalline silicon active layer, a dielectric isolation layer, a silicon substrate, and at least one isolation trench defining an active region in the silicon active layer, in which the silicon active layer is formed on the dielectric isolation layer and the dielectric isolation layer is formed on the silicon substrate;
   wherein the at least one isolation trench is filled with a tensile stress-reducing low density silicon dioxide trench isolation material which comprises spacers comprising a dielectric gas.

2. The silicon-on-insulator semiconductor device of claim 1, wherein the tensile stress-reducing low density trench isolation material has a dielectric constant in the range from about 1.05 to about 3.5.

3. The silicon-on-insulator semiconductor device of claim 1, wherein the at least one trench further comprises a liner oxide, and the dielectric isolation layer, the liner oxide and the tensile stress-reducing low density trench isolation material each comprise silicon dioxide.

4. The silicon-on-insulator semiconductor device of claim 1, wherein the at least one trench further comprises a liner oxide, and the liner oxide is in contact with the dielectric isolation layer.

5. The silicon-on-insulator semiconductor device of claim 1, wherein the at least one isolation trench has a width, and the at least one isolation trench penetrates through the silicon active layer across the width of the trench.

6. The silicon-on-insulator semiconductor device of claim 1, wherein the silicon active layer further comprises a rounded upper corner of the at least one isolation trench.

7. A silicon-on-insulator semiconductor device, comprising:
   a silicon-on-insulator wafer having a monocrystalline silicon active layer, a dielectric isolation layer, a silicon substrate, and at least one isolation trench defining an active region in the silicon active layer, in which the silicon active layer is formed on the dielectric isolation layer and the dielectric isolation layer is formed on the silicon substrate;
   wherein the at least one isolation trench is filled with a tensile stress-reducing low density low dielectric constant trench isolation material having spacers comprising a dielectric gas.

8. The silicon-on-insulator semiconductor device of claim 7, wherein the silicon active layer further comprises a rounded upper corner of the at least one isolation trench.

9. The silicon-on-insulator semiconductor device of claim 7, wherein the at least one isolation trench is lined with a liner oxide, and the liner oxide is in contact with the dielectric isolation layer.

10. The silicon-on-insulator semiconductor device of claim 9, wherein the dielectric isolation layer, the liner oxide and the tensile stress-reducing low density trench isolation material form a combined structure in which the dielectric isolation layer, the liner oxide and the tensile stress-reducing low density trench isolation material are not distinctly separated.

11. The silicon-on-insulator semiconductor device of claim 7, wherein the at least one isolation trench has a width, and the at least one isolation trench penetrates through the silicon active layer across the width of the trench.

12. The silicon-on-insulator semiconductor device of claim 7, wherein the dielectric constant of the tensile stress-reducing low density trench isolation material is in the range from about 1.25 to about 2.0.

13. A silicon-on-insulator semiconductor device, comprising:
   a silicon-on-insulator wafer having a monocrystalline silicon active layer, a dielectric isolation layer, a silicon substrate, and at least one isolation trench defining an active region in the silicon active layer, in which the silicon active layer is formed on the dielectric isolation layer and the dielectric isolation layer is formed on the silicon substrate;
   wherein the at least one isolation trench has a width, and the at least one isolation trench penetrates through the silicon active layer across the width of the trench,
   the silicon active layer further comprises a rounded upper corner of the at least one isolation trench, and
   the at least one isolation trench is lined with a liner oxide and is filled with a tensile stress-reducing low density silicon dioxide trench isolation material having spacers comprising a dielectric gas, and the liner oxide is in contact with the dielectric isolation layer.

14. The silicon-on-insulator semiconductor device of claim 13, wherein the dielectric isolation layer, the liner oxide and the tensile stress-reducing low density trench isolation material form a combined structure in which the dielectric isolation layer, the liner oxide and the tensile stress-reducing low density trench isolation material are not distinctly separated from each other.

15. The silicon-on-insulator semiconductor device of claim 13, wherein the dielectric isolation layer, the liner oxide and the tensile stress-reducing low density trench isolation material each comprise silicon dioxide.

* * * * *